US010613597B2

(12) United States Patent
Liu et al.

(10) Patent No.: US 10,613,597 B2
(45) Date of Patent: Apr. 7, 2020

(54) SHOCK ABSORBING SCREW FOR CONNECTING HARD DISK TO HARD DISK FRAME

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Xiao-Ming Liu, Wuhan (CN); He-Tao Han, Wuhan (CN); Jun-Hua Tan, Wuhan (CN); Zhi-Qiang Li, Wuhan (CN); Yi-Sheng Lin, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/175,864

(22) Filed: Oct. 31, 2018

(65) Prior Publication Data
US 2019/0333543 A1 Oct. 31, 2019

(30) Foreign Application Priority Data
Apr. 28, 2018 (CN) .......................... 2018 1 0408485

(51) Int. Cl.
*G06F 1/18* (2006.01)
*G11B 33/08* (2006.01)
(Continued)

(52) U.S. Cl.
CPC ................ *G06F 1/187* (2013.01); *F16F 7/00* (2013.01); *G06F 1/1656* (2013.01);
(Continued)

(58) Field of Classification Search
CPC ....... G06F 1/187; G06F 1/1656; G06F 1/1658
See application file for complete search history.

(56) References Cited

U.S. PATENT DOCUMENTS 6,917,520 B2 * 7/2005 Lin .......................... G06F 1/184
248/917
7,137,767 B2 * 11/2006 Franke .................. F16F 1/3732
411/401
(Continued)

*Primary Examiner* — Nidhi Thaker
(74) *Attorney, Agent, or Firm* — ScienBiziP, P.C.

(57) ABSTRACT

A shock absorbing screw includes a locking member, a friction member sleeved on the locking member, and a connecting frame sleeved on the friction member. The shock absorbing screw is connected to a hard disk by a connecting portion of the shock absorbing screw. An abutting portion of the shock absorbing screw is connected to the friction member. The connecting portion is passed through a second through hole defined in the friction member. A first end of the connecting frame includes a first clamping portion, a second end of the connecting frame includes a second clamping portion, and a second groove is defined between the first clamping portion and the second clamping portion. The shock absorbing screw is connected to a hard disk frame in the second groove. The friction member is connected to the connecting frame through a first through hole defined in the connecting frame.

9 Claims, 6 Drawing Sheets

(51) Int. Cl.
*G11B 33/02* (2006.01)
*H05K 7/14* (2006.01)
*F16F 7/00* (2006.01)
*G06F 1/16* (2006.01)

(52) U.S. Cl.
CPC .......... *G06F 1/1658* (2013.01); *G11B 33/027* (2013.01); *G11B 33/08* (2013.01); *H05K 7/1407* (2013.01)

(56) References Cited

U.S. PATENT DOCUMENTS

| | | | | |
|---|---|---|---|---|
| 8,137,041 | B2* | 3/2012 | Zhou | F16B 5/0241 |
| | | | | 411/353 |
| 8,842,426 | B2* | 9/2014 | Chou | G06F 1/181 |
| | | | | 248/635 |
| 9,022,711 | B2* | 5/2015 | Wu | F16B 5/0241 |
| | | | | 248/562 |
| 2004/0113339 | A1* | 6/2004 | Masterson | F16F 1/3732 |
| | | | | 267/153 |
| 2007/0025014 | A1* | 2/2007 | Kim | G11B 33/08 |
| | | | | 360/97.19 |
| 2009/0057525 | A1* | 3/2009 | Yeh | F16F 15/08 |
| | | | | 248/638 |
| 2009/0059506 | A1* | 3/2009 | Yeh | G06F 1/187 |
| | | | | 361/679.34 |
| 2010/0039766 | A1* | 2/2010 | Chiang | F16F 15/08 |
| | | | | 361/679.34 |
| 2012/0293945 | A1* | 11/2012 | Wang | G11B 33/08 |
| | | | | 361/679.33 |

* cited by examiner

SHOCK ABSORBING SCREW FOR CONNECTING HARD DISK TO HARD DISK FRAME

FIELD

The subject matter herein generally relates to hard disk assemblies, and more particularly to a shock absorbing screw for connecting a hard disk to a hard disk frame.

BACKGROUND

Generally, a hard disk of a computer is mounted in a hard disk frame, and the hard disk frame is mounted in a chasses of the computer.

BRIEF DESCRIPTION OF THE DRAWINGS

Implementations of the present disclosure will now be described, by way of example only, with reference to the attached figures.

DETAILED DESCRIPTION

Figure 1:
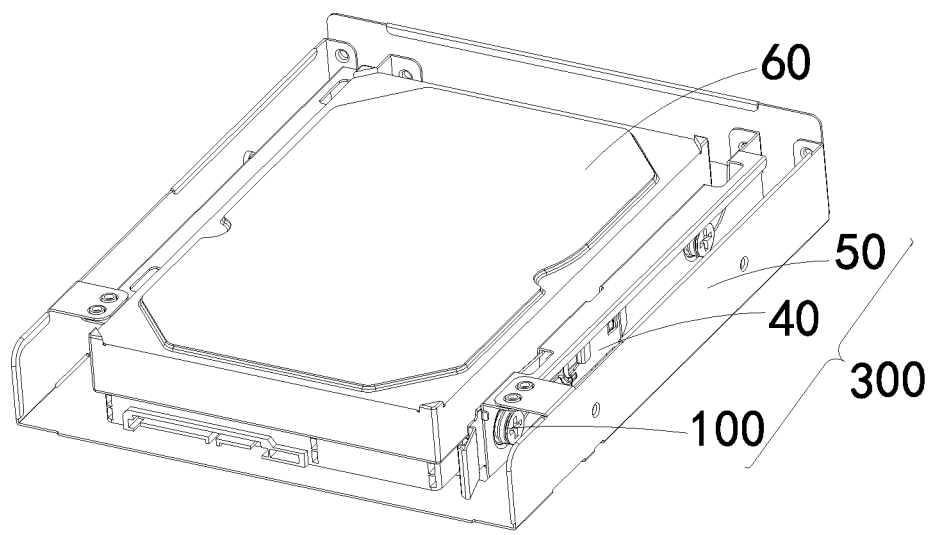
FIG. 1 is an assembled, isometric view of an embodiment of a hard disk assembly of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series and the like.

Figure 2:
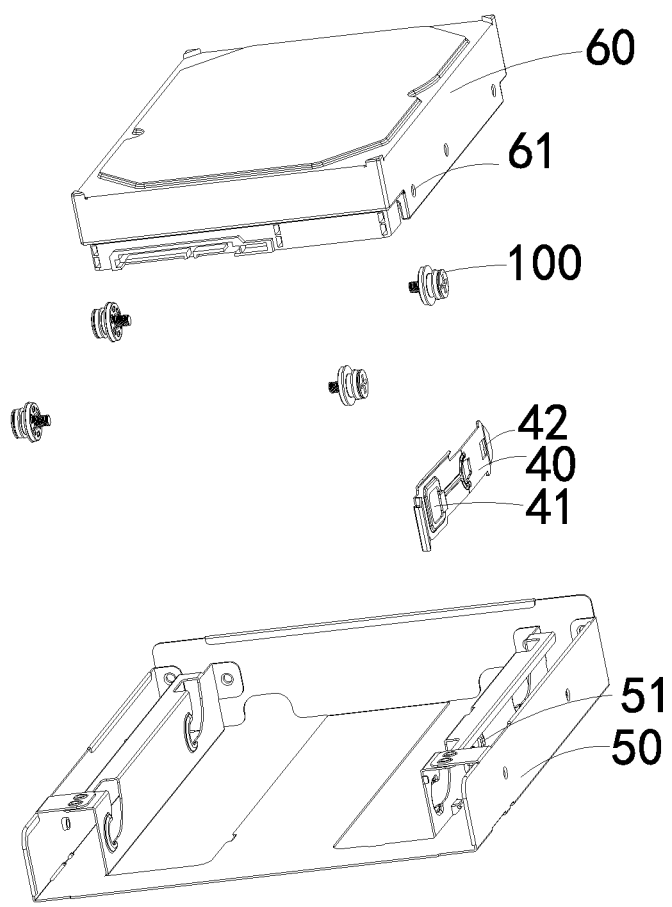
FIG. 2 is an exploded, isometric view of the hard disk assembly in FIG. 1.
Figure 3:
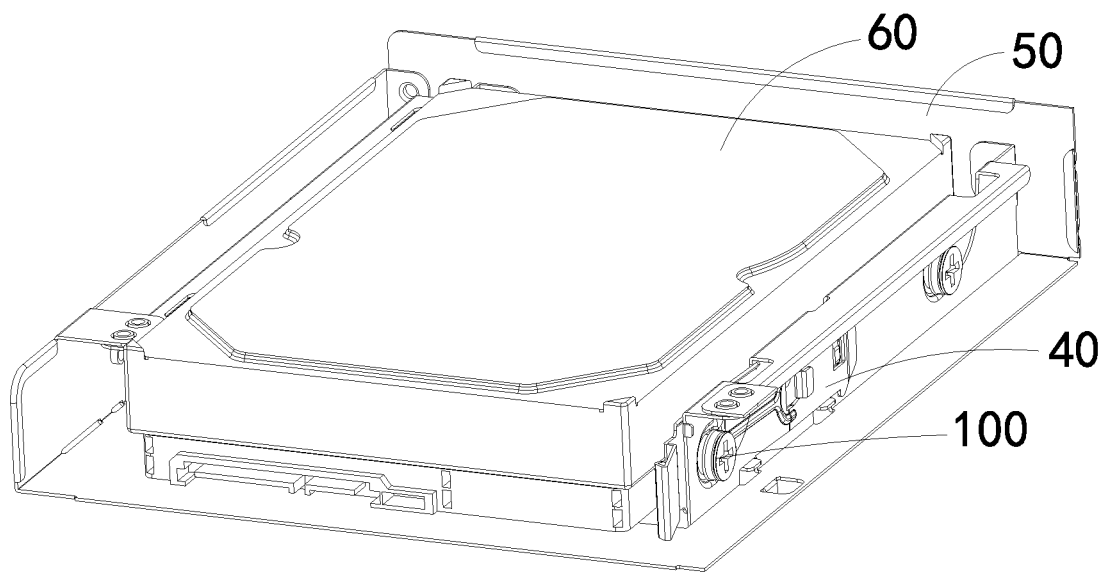
FIG. 3 is a partial cutaway view of the hard disk assembly in FIG. 1.
Figure 4:
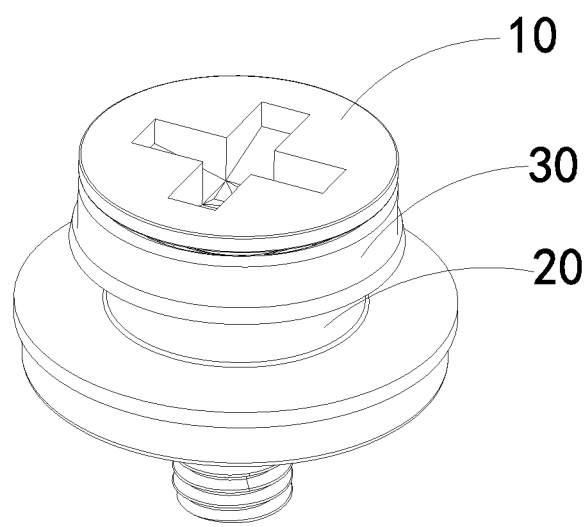
FIG. 4 is an isometric view of a shock absorbing screw of the hard disk assembly in FIG. 1.
Figure 5:
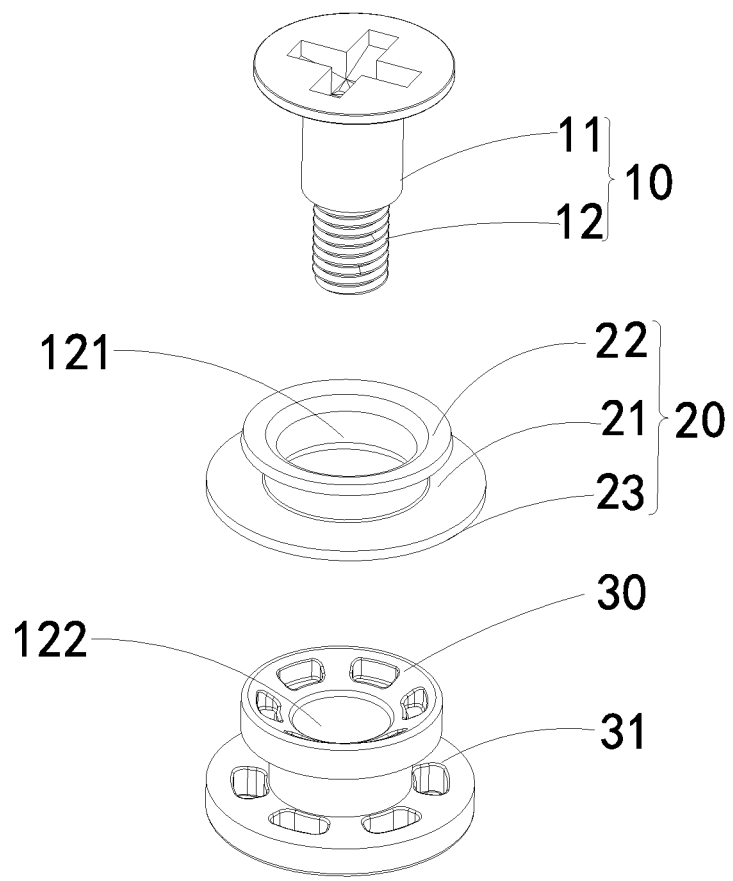
FIG. 5 is an exploded view of the shock absorbing screw in FIG. 4.
Figure 6:
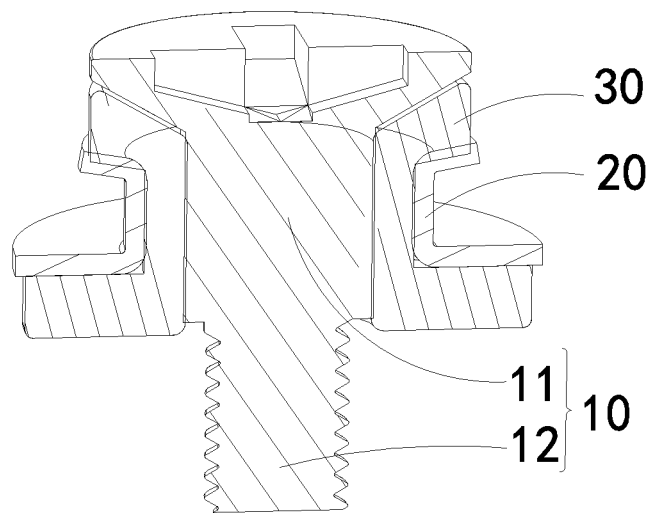
FIG. 6 is a cross-sectional view of the shock absorbing screw in FIG. 4.

FIGS. 1-6 illustrate an embodiment of a shock absorbing screw 100 for connecting a hard disk 60 to a hard disk frame 50. The shock absorbing screw 100 includes a locking member 10, a friction member 30 sleeved on the locking member 10, and a connecting frame 30 sleeved on the friction member 30. The locking member 10 includes an abutting portion 11 and a connecting portion 12 located at a first end and a second end thereof, respectively. The shock absorbing screw 100 is connected to the hard disk 60 through the connecting portion 12. The connecting frame 20 includes a first clamping portion 22 and a second clamping portion 23 located at a first end and a second end thereof, respectively. The first clamping portion 22 and the second clamping portion 23 correspond to the abutting portion 11 and the connecting portion 12, respectively. A center of the connecting frame 20 defines a first through hole 121. The friction member 30 passes through the first through hole 121 to be connected to the connecting frame 20. A center of the friction member 30 defines a second through hole 122. The locking member 10 passes through the second through hole 122 to be connected to the friction member 30. The first clamping portion 22 abuts against the abutting portion 11 through the friction member 30, and the second clamping portion 23 is connected through the friction member 30 to a junction between the abutting portion 11 and the connecting portion 12. A second groove 21 is defined between the first clamping portion 22 and the second clamping portion 23. The shock absorbing screw 100 is connected to the hard disk frame 50 through the second groove 21.

A structure of the friction member 30 is similar to a structure of the connecting frame 20. The two ends of the friction member 30 include the first clamping portion 22 and the second clamping portion 23, respectively. The connecting frame 20 is connected to the abutting portion 11 by the first clamping portion 22 and the second clamping portion 23.

A first end of the abutting portion 11 comprises a screw cap, and a second end of the abutting portion 11 comprises a screw. A width of the second through hole 122 is equal to a width of the screw, and a width of the first through hole 121 is equal to a width of the friction member 30.

A first groove 31 is defined between the first clamping portion 22 and the second clamping portion 23 within the friction member 30. A length of the connecting frame 20 is less than a length of the friction member 30, and the connecting frame 20 is latched within the first groove 31.

The locking member 10 is received within the second through hole 122, and the abutting portion 11 is connected to the friction member 30. The connecting portion 12 is passed through the second through hole 122.

A hard disk connecting device 300 for connecting the hard disk 60 includes a flexible piece 40, the connecting frame 50, and the shock absorbing screw 100. The shock absorbing screw 100 is connected to the hard disk frame 50 through the flexible piece 40. The shock absorbing screw 100 includes the locking member 10, the friction member 30 sleeved on the locking member 10, and the connecting frame 20 sleeved on the friction member 30. The locking member 10 includes the abutting portion 11 and the connecting portion 12 located at a first end and a second end thereof, respectively. The shock absorbing screw 100 is connected to the hard disk 60 through the connecting portion 12. The connecting frame 20 includes the first clamping portion 22 and the second clamping portion 23 located at a first end and a second end thereof, respectively. The first clamping portion 22 and the second clamping portion 23 correspond to the abutting portion 11 and the connecting portion 12, respectively. A center of the connecting frame 20 defines the first through hole 121. The friction member 30 passes through the first through hole 121 to be connected to the connecting frame 20. A center of the friction member 30 defines the second through hole 122. The locking member 10 passes through the second through hole 122 to be connected to the friction member 30. The first clamping portion 22 abuts against the abutting portion 11 through the friction member 30, and the second clamping portion 23 is connected through the friction member 30 to a junction between the abutting portion 11 and the connecting portion 12. A second groove 21 is defined between the first clamping portion 22 and the second clamping portion 23. The shock absorbing screw 100 is connected to the flexible piece 40 through the second groove 21.

The flexible piece 40 defines a sliding groove 41 corresponding to the shock absorbing screw 100. A first end of the sliding groove 41 has a width greater than a width of the shock absorbing screw 100, and a second end of the sliding groove 41 has a width equal to the width of the shock absorbing screw 100. The shock absorbing screw 100 is slid from the first end of the sliding groove 41 to the second end of the sliding groove 41. The connecting frame 20 is latched through the second groove 21 within the sliding groove 41.

A width of the second groove 21 corresponds to a thickness of the flexible piece 40.

The flexible piece 40 defines a third through hole 42. The hard disk frame 50 includes a protrusion 51 corresponding to the third through hole 42. The flexible piece 40 is connected to the hard disk frame 50 through the third through hole 42.

A hard disk assembly 200 includes the flexible piece 40, the hard disk frame 50, the shock absorbing screw 100, and the hard disk 60. A first end of the shock absorbing screw 100 is connected to the hard disk 60, and a second end of the shock absorbing screw 100 is connected to the hard disk frame 50 through the flexible piece 40. The shock absorbing screw 100 includes the locking member 10, the friction member 30 sleeved on the locking member 10, and the connecting frame 20 sleeved on the friction member 30. The locking member 10 includes the abutting portion 11 and the connecting portion 12 located at a first end and a second end thereof, respectively. The shock absorbing screw 100 is connected to the hard disk 60 through the connecting portion 12. The connecting frame 20 includes the first clamping portion 22 and the second clamping portion 23 located at a first end and a second end thereof, respectively. The first clamping portion 22 and the second clamping portion 23 correspond to the abutting portion 11 and the connecting portion 12, respectively. A center of the connecting frame 20 defines the first through hole 121. The friction member 30 passes through the first through hole 121 to be connected to the connecting frame 20. A center of the friction member 30 defines the second through hole 122. The locking member 10 passes through the second through hole 122 to be connected to the friction member 30. The first clamping portion 22 abuts against the abutting portion 11 through the friction member 30, and the second clamping portion 23 is connected through the friction member 30 to a junction between the abutting portion 11 and the connecting portion 12. A second groove 21 is defined between the first clamping portion 22 and the second clamping portion 23. The shock absorbing screw 100 is connected to the flexible piece 40 through the second groove 21.

The hard disk 60 defines a fourth through hole 61 corresponding to the connecting portion 12. The fourth through hole 61 defines a plurality of threaded grooves corresponding to the connecting portion 12. The shock absorbing screw 100 is connected to the hard disk 60 through the connecting portion 12.

The shock absorbing screw 100 as described above includes the connecting frame 20 sleeved on the locking member 10, and the second groove 21 defined between the first clamping portion 22 and the second clamping portion 23 of the connecting frame 20. A first end of the shock absorbing screw 100 is connected to the hard disk frame 50 through the second groove 21, and a second end of the shock absorbing screw 100 is connected to the hard disk 60 through the connecting portion 12. Thus, the shock absorbing screw 100 provides convenient installation and removal of the hard disk 60.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A hard disk connecting device configured for connecting a hard disk, the hard disk connecting device comprising:
   a flexible piece;
   a hard disk frame; and
   a shock absorbing screw connected to the hard disk frame through the flexible piece; wherein the shock absorbing screw comprises:
   a locking member;
      a friction member sleeved on the locking member; and
      a connecting frame sleeved on the friction member; wherein:
   a first end of the locking member comprises an abutting portion corresponding to the connecting frame, and a second end of the locking member comprises a connecting portion;
   the shock absorbing screw is connected to the hard disk by the connecting portion;
   a center of the friction member defines a second through hole corresponding to the connecting portion, and the connecting portion is received through the second through hole;
   the abutting portion is connected to the friction member;
   the connecting portion is passed through the second through hole;
   a first end of the connecting frame comprises a first clamping portion, a second end of the connecting frame comprises a second clamping portion, and a second groove is defined between the first clamping portion and the second clamping portion;
   the shock absorbing screw is connected to the hard disk frame in the second groove;
   a center of the connecting frame defines a first through hole through the first clamping portion, the second groove, and the second clamping portion in sequence;
   the friction member is connected to the connecting frame through the first through hole.

2. The hard disk connecting device of claim 1, wherein the flexible piece defines a sliding groove corresponding to the shock absorbing screw; a first end of the sliding groove has a width greater than a width of the shock absorbing screw, and a second end of the sliding groove has a width equal to the width of the shock absorbing screw; the shock absorbing screw is slid from the first end of the sliding groove to the second end of the sliding groove; the connecting frame is latched within the sliding groove through the second groove.

3. The hard disk connecting device of claim 1, wherein a width of the second groove corresponds to a thickness of the flexible piece.

4. The hard disk connecting device of claim 1, wherein the flexible piece defines a third through hole; the hard disk frame comprises a protrusion corresponding to the third through hole;
the flexible piece is connected to the hard disk frame through the third through hole.

5. The hard disk connecting device of claim 1, wherein the first clamping portion abuts against the abutting portion through the friction member; and the second clamping portion is connected through the friction member at a junction between the abutting portion and the connecting portion.

6. The hard disk connecting device of claim 1, wherein the connecting frame is clamped and connected between a first clamping portion and a second clamping portion of the friction member.

7. The hard disk connecting device of claim 6, wherein a first groove is defined between the first clamping portion and the second clamping portion of the friction member; a length of the connecting frame is less than a length of the friction member, and the connecting frame is latched within the first groove.

8. The hard disk connecting device of claim 1, wherein a first end of the abutting portion comprises a screw cap, a second end of the abutting portion comprises a screw; a size of the second through hole corresponds to a size of the screw; a size of the first through hole corresponds to a size of the friction member.

9. A hard disk assembly comprising:
a flexible piece;
a hard disk frame;
a shock absorbing screw; and
a hard disk; wherein:
a first end of the shock absorbing screw is connected to the hard disk, and a second end of the shock absorbing screw is connected to the hard disk frame through the flexible piece, wherein the shock absorbing screw comprises:
a locking member;
a friction member sleeved on the locking member; and
a connecting frame sleeved on the friction member; wherein:
a first end of the locking member comprises an abutting portion corresponding to the connecting frame, and a second end of the locking member comprises a connecting portion;
the shock absorbing screw is connected to the hard disk by the connecting portion;
a center of the friction member defines a second through hole corresponding to the connecting portion, and the connecting portion is received through the second through hole;
the abutting portion is connected to the friction member;
the connecting portion is passed through the second through hole;
a first end of the connecting frame comprises a first clamping portion, a second end of the connecting frame comprises a second clamping portion, and a second groove is defined between the first clamping portion and the second clamping portion;
the shock absorbing screw is connected to the hard disk frame in the second groove;
a center of the connecting frame defines a first through hole through the first clamping portion, the second groove, and the second clamping portion in sequence;
the friction member is connected to the connecting frame through the first through hole.

* * * * *